US005703335A

United States Patent [19]

Deutsch

[11] Patent Number: 5,703,335

[45] Date of Patent: Dec. 30, 1997

[54] MARINE HORN ASSEMBLY FOR MOUNTING ON A BOAT WALL STRUCTURE

[75] Inventor: Peter K. Deutsch, Novato, Calif.

[73] Assignee: Marinco, Napa, Calif.

[21] Appl. No.: 588,551

[22] Filed: Jan. 18, 1996

[51] Int. Cl.[6] .................................. H05K 5/00; G08B 3/00

[52] U.S. Cl. .................... 181/150; 116/137 R; 340/391.1

[58] Field of Search ..................................... 181/150, 152, 181/189, 190, 149, 177; 116/24, 26, 137 R; 340/388.1, 391.1, 984

[56] References Cited

U.S. PATENT DOCUMENTS 4,079,364 3/1978 Antenore .
4,281,224 7/1981 Castagna .
4,710,749 12/1987 Berke et al. .
4,825,800 5/1989 Kitchen .
4,997,059 3/1991 See .
5,099,220 3/1992 Camarota .
5,113,968 5/1992 Lemmon .............................. 181/150 X
5,331,119 7/1994 Leger et al. .
5,414,229 5/1995 Rocheleau et al. .

*Primary Examiner*—Khanh Dang
*Attorney, Agent, or Firm*—Thomas R. Lampe

[57] ABSTRACT

A marine horn assembly for mounting on a boat wall structure includes a horn support with a generally flat mounting plate for flush attachment to the boat wall structure and a support element extending laterally from the mounting plate into a wall opening formed in the boat wall structure. A horn is rigidly connected to the support element and supported by the support element at the inner side of the boat wall structure and at a location spaced from the mounting plate. A grill member is frictionally secured to the mounting plate and covers the mounting plate, the wall opening and mechanical fasteners used to attach the mounting plate to the boat wall structure.

8 Claims, 2 Drawing Sheets

MARINE HORN ASSEMBLY FOR MOUNTING ON A BOAT WALL STRUCTURE

TECHNICAL FIELD

This invention relates to a marine horn assembly for mounting on the wall structure of a boat, particularly a small marine craft.

BACKGROUND ART

Horns are considered to be essential accessories on marine craft. On smaller boats in particular it is desirable to have a horn which is easy to install, has a low external profile to avoid inadvertent contact by the boat's occupants, and presents an attractive appearance. With regard to installation, it is highly desirable to provide an arrangement which will enable an individual to install a wall structure mounted horn on his or her own and from only one side of the wall structure. As to appearance, it is common practice to employ mechanical fasteners such as wood screws to attach a marine horn assembly to a boat wall structure, and it is highly desirable to cover the fasteners to improve the aesthetic appearance of the installed assembly.

The following patents are believed representative of the current state of the prior art with regard to marine horn installations and similar structures: U.S. Pat. No. 5,099,220, issued Mar. 24, 1992, U.S. Pat. No. 4,825,800, issued May 2, 1989, U.S. Pat. No. 4,281,224, issued Jul. 28, 1981, U.S. Pat. No. 4,997,059, issued Mar. 5, 1991, U.S. Pat. No. 5,414,229, issued May 9, 1995, U.S. Pat. No. 5,331,119, issued Jul. 19, 1994, U.S. Pat. No. 4,710,749, issued Dec. 1, 1987, and U.S. Pat. No. 4,079,364, issued Mar. 14, 1978.

None of these patents discloses the marine horn assembly disclosed and claimed herein and which is characterized by its relative simplicity, ease of installation and attractive appearance.

DISCLOSURE OF INVENTION

The present invention relates to a marine horn assembly for mounting on a boat wall structure having inner and outer sides and defining a wall opening extending between the inner and outer sides. The assembly is characterized by its relative simplicity and relatively low cost as compared to many prior art structures, both with regard to equipment and installation costs. The assembly readily can be installed on a marine craft by a single individual from only one side of the wall structure on which the assembly is being installed. Furthermore, the assembly presents an aesthetically pleasing appearance with no external screws, bolts or other hardware being observable by the boat's occupants.

The marine horn assembly includes a horn support including a generally flat mounting plate for flush attachment to the boat wall structure at the outer side thereof by mechanical fastener means. The mounting plate has an outer peripheral wall extending about the wall opening when the mounting plate is attached to the boat wall support by the mechanical fastener means.

The horn support additionally includes a support element rigidly connected to and solely supported by the mounting plate and extending through the wall opening and beyond the inner side of the boat wall structure when the mounting plate is attached to the boat wall structure by the mechanical fastener means.

A horn is rigidly connected to the support element and solely supported by the support element at the inner side of the boat wall structure and at a location spaced from the mounting plate when the mounting plate is attached to the boat wall structure by the mechanical fastener means.

The marine horn assembly also includes a grill member having at least one grill opening. The grill member is frictionally secured to the mounting plate and covers the mounting plate, the wall opening and the mechanical fastener means attaching the mounting plate to the boat wall structure. The grill member is flush mounted with respect to both the mounting plate and the boat wall structure at the outer side of the boat wall structure.

A plurality of bosses project from the grill member and the horn support defines a plurality of horn support openings for receiving the bosses. The bosses are frictionally engaged with the horn support when received by the horn support openings to releasably secure the grill member to the mounting plate.

Other features, advantages, and objects of the present invention will become apparent with reference to the following description and accompanying drawings.

BEST MODE FOR CARRYING OUT THE INVENTION

Figure 1:
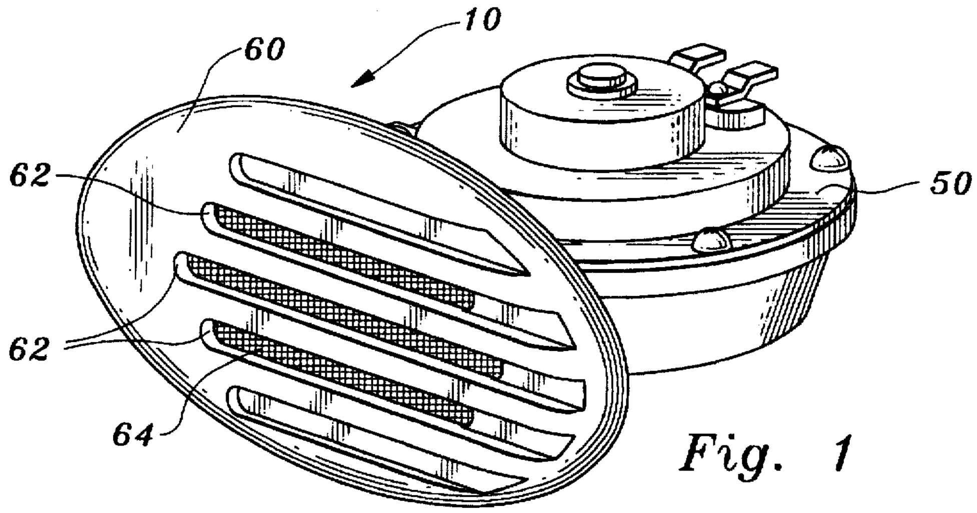
FIG. 1 is a frontal perspective view of a marine horn assembly constructed in accordance with the teachings of the present invention.
Figure 2:
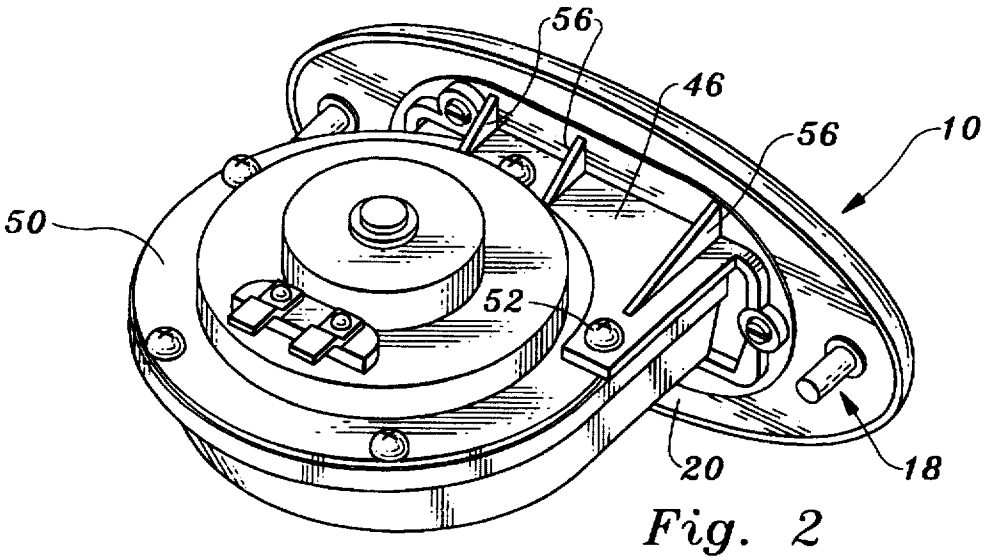
FIG. 2 is a rear perspective view of the marine horn assembly.
Figure 3:
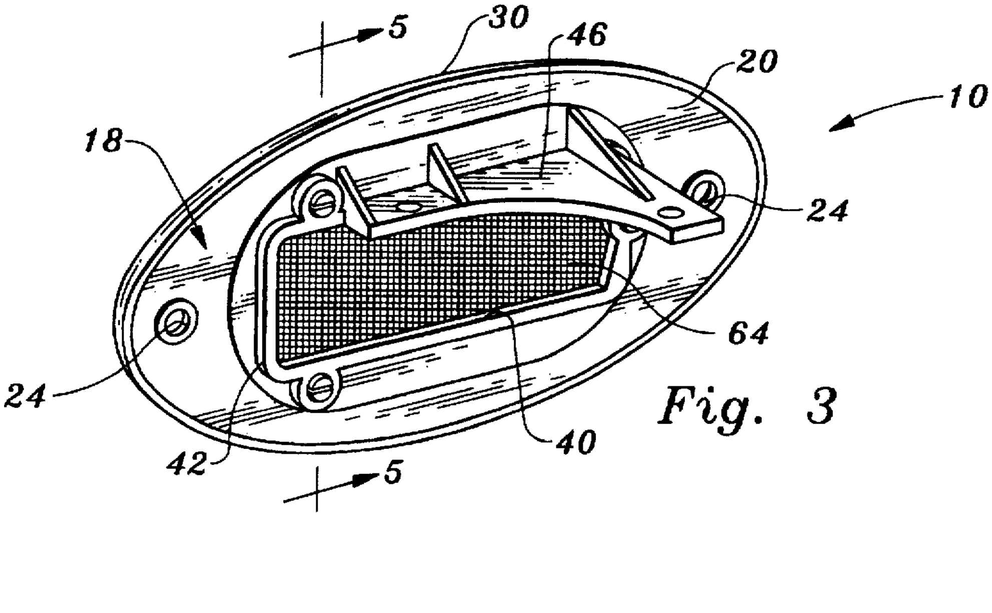
FIG. 3 is a rear perspective view of the horn support component of the marine horn assembly.
Figure 4:
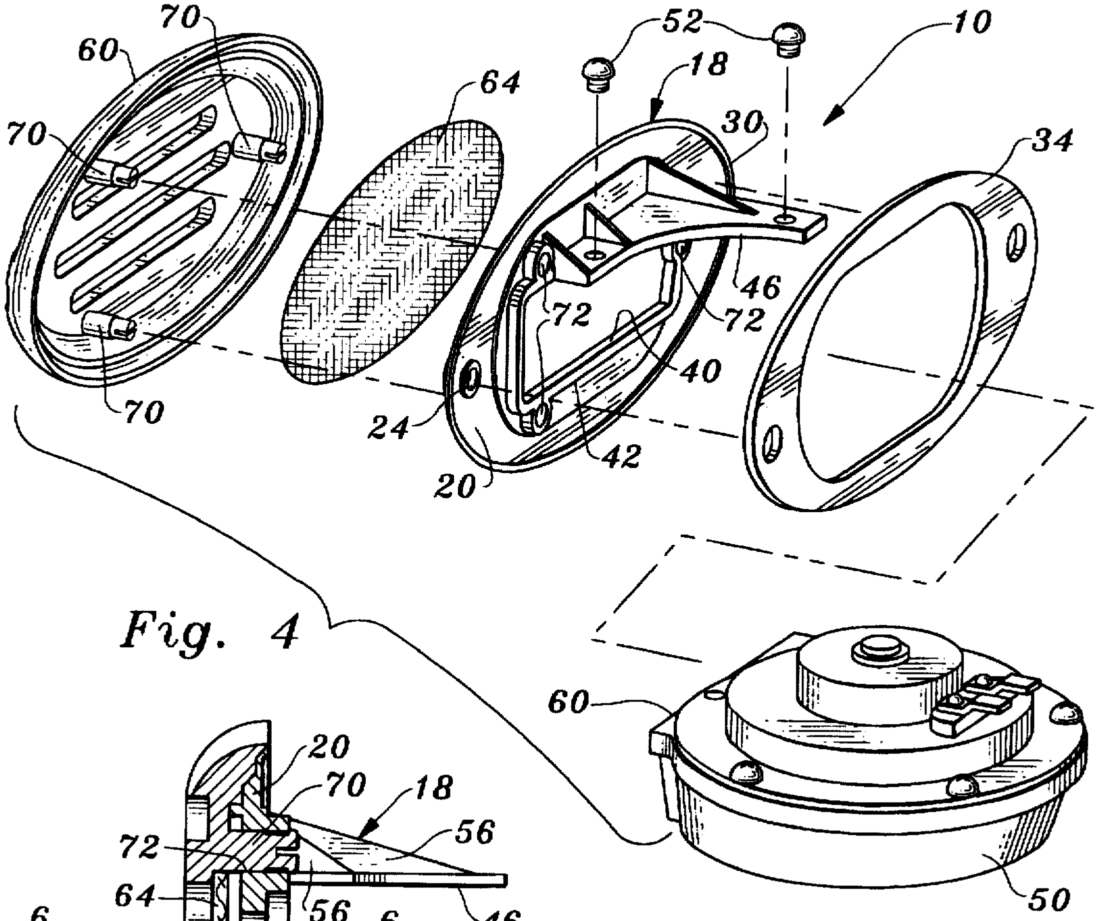
FIG. 4 is an exploded view illustrating the structural components of the marine horn assembly.
Figure 5:
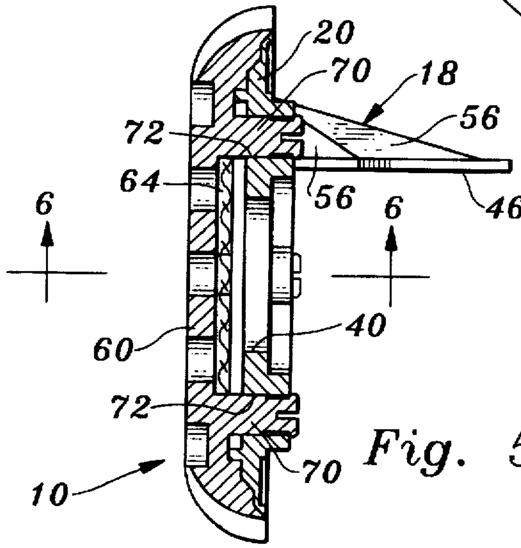
FIG. 5 is an enlarged sectional view taken along the line 5—5 in FIG. 3 of the horn support component and showing the horn support component connected to the grill member component of the marine horn structure.

Referring now to the drawings, a marine horn assembly constructed in accordance with the teachings of the present invention is designated by reference numeral 10. Assembly 10 is for mounting on a boat wall structure such as that shown in FIG. 6 and designated by reference numeral 12. Structure 12 has an inner side 14 and an outer side 16 and opening 17 is defined by the wall structure and extends between the inner and outer sides.

Again referring to all of the figures of the drawings, the marine horn assembly 10 includes a horn support 18 preferably formed of molded plastic material. Horn support 18 includes a generally flat mounting plate 20 for flush attachment to the boat wall structure 12 at the outer side 16 thereof. Attachment is accomplished by mechanical fastener means such as wood screws 22 (FIG. 6) which pass through openings 24 defined by the mounting plate.

Figure 6:
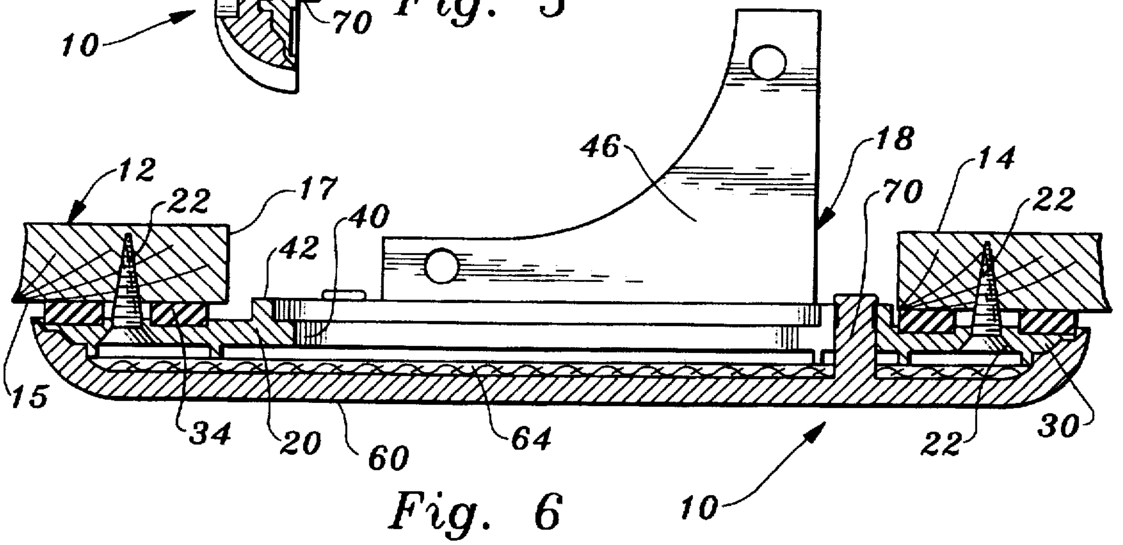
FIG. 6 is a view of the structural components shown in FIG. 5 taken along the line 6-6 but illustrating such structure installed in place on a boat wall structure by mechanical fasteners.

The mounting plate has an outer peripheral wall 30 which extends about the wall opening 17 when the mounting plate is attached to the boat wall structure by the mechanical fasteners as shown in FIG. 6.

A resilient gasket member formed of rubber or other suitable material is compressed between the mounting plate and the boat wall structure at the outer side of the boat wall structure when the mounting plate is attached by the mechanical fasteners. The gasket member is designated by reference number 34. The outer peripheral wall 30 of the mounting plate is continuous and defines a mounting plate recess, the gasket member being positioned within the confines of the mounting plate outer peripheral wall within the recess.

An aperture 40 is defined by the mounting plate. A portion 42 of the mounting plate is of increased thickness to enhance structural rigidity and defines the aperture 40.

Horn support 18 also includes a support element 46 which projects laterally from the mounting plate and is employed to support a horn 50, horn 50 being an electrically operated horn of any suitable prior art construction and being smaller than wall opening 17 formed in the boat wall structure.

Support element 46 is rigidly integrally connected to and solely supported by the mounting plate and extends through the wall opening 17 and beyond the inner side of the boat wall structure when the mounting plate is attached to the boat wall structure by mechanical fasteners. Since the horn 50 is smaller than the wall opening 17, the horn may readily be inserted through the wall opening from the outer side thereof during installation, greatly facilitating such installation. Horn 50 is connected to support element 46 by screws 52 prior to installation of the marine horn assembly. The bottom surface of the support element 46 abuts against the horn when the horn is secured to the mounting plate.

A plurality of ribs 56 are integral with and rigidly interconnect the mounting plate and the support element to provide structural rigidity to that particular portion of the assembly so that the horn is rigidly affixed in place when the marine horn assembly is installed. The horn has a sound emitter opening defined at end 60 of the horn. The horn is supported by the support element so that the sound emitter opening is located closely adjacent to the mounting plate with the sound emitter opening disposed immediately adjacent to the aperture 40 of the mounting plate.

Another component of the marine horn assembly is a grill member 60 having grill openings 62 therein. A liquid impermeable membrane 64 is positioned at the back side of the grill member.

After the horn 50 has been passed through the wall opening 17 and the horn support 18 secured in place on the boat wall structure by wood screws 22, the grill member 60 is positioned over the mounting plate and frictionally secured thereto. Bosses 70 project outwardly from the back side of the grill member and are positioned in a friction fit manner into openings 72 defined by the horn support. When the grill member is installed in position relative to the horn support the grill member covers the mounting plate, wall opening 17 and the wood screws 22. The grill member is flush mounted with respect to both the mounting plate and the boat wall structure at the outer side of the boat wall structure, presenting a pleasing aesthetic appearance. The grill member may be manually removed at any time merely by exerting an outwardly directed force thereon by a screw driver or other suitable tool.

I claim:

1. A marine horn assembly for mounting on a boat wall structure having inner and outer sides and defining a wall opening extending between said inner and outer sides, said marine horn assembly comprising, in combination:

- a horn support including a generally flat mounting plate for flush attachment to said boat wall structure at said outer side thereof by mechanical fastener means and having a mounting plate outer peripheral wall extending about said wall opening when said mounting plate is attached to said boat wall structure by said mechanical fastener means, said horn support additionally including a support element rigidly connected to and solely supported by said mounting plate and extending through said wall opening and beyond the inner side of the boat wall structure when said mounting plate is attached to said boat wall structure by said mechanical fastener means;
- a horn rigidly connected to said support element and solely supported by said support element at the inner side of said boat wall structure and at a location spaced from said mounting plate when said mounting plate is attached to said boat wall structure by said mechanical fastener means;
- a grill member having at least one grill opening, said grill member being frictionally secured to said mounting plate and covering said mounting plate, said wall opening and said mechanical fastener means attaching said mounting plate to said boat wall structure by said mechanical fastener means, said grill member being flush mounted with respect to both said mounting plate and said boat wall structure at the outer side of the boat wall structure; and
- a plurality of bosses projecting from said grill member, said horn support defining a plurality of horn support openings for receiving said bosses and said bosses being frictionally engaged with said horn support when received by said horn support openings to releasably secure said grill member to said mounting plate.

2. The marine horn assembly according to claim 1 wherein said horn is smaller than the opening defined by said boat wall structure to facilitate installation of the marine horn assembly from said boat wall structure outer side.

3. The marine horn assembly according to claim 1 additionally comprising a water impermeable membrane between said grill member and said mounting plate.

4. A marine horn assembly for mounting on a boat wall structure having inner and outer sides and defining a wall opening extending between said inner and outer sides, said marine horn assembly comprising, in combination:

- a horn support including a generally flat mounting plate for flush attachment to said boat wall structure at said outer side thereof by mechanical fastener means and having a mounting plate outer peripheral wall extending about said wall opening when said mounting plate is attached to said boat wall structure by said mechanical fastener means, said horn support additionally including a support element rigidly connected to and solely supported by said mounting plate and extending through said wall opening and beyond the inner side of the boat wall structure when said mounting plate is attached to said boat wall structure by said mechanical fastener means;
- a horn rigidly connected to said support element and solely supported by said support element at the inner side of said boat wall structure and at a location spaced from said mounting plate when said mounting plate is attached to said boat wall structure by said mechanical fastener means;
- a grill member having at least one grill opening, said grill member being frictionally secured to said mounting plate and covering said mounting plate, said wall opening and said mechanical fastener means attaching said mounting plate to said boat wall structure by said mechanical fastener means, said grill member being flush mounted with respect to both said mounting plate and said boat wall structure at the outer side of the boat wall structure; and a resilient gasket member compressed between said mounting plate and said boat wall structure at the outer side of the boat wall structure when said mounting plate is attached to said boat wall structure by said mechanical fastener means.

5. The marine horn assembly according to claim 4 wherein said mounting plate outer peripheral wall is continuous and defines a mounting plate recess, said resilient gasket member being positioned within the confines of said mounting plate outer peripheral wall within said recess.

6. A marine assembly for mounting on a boat wall structure having inner and outer sides and defining a wall opening extending between said inner and outer sides, said marine horn assembly comprising, in combination:

a horn support including a generally flat mounting plate for flush attachment to said boat wall structure at said outer side thereof by mechanical fastener means and having a mounting plate outer peripheral wall extending about said wall opening when said mounting plate is attached to said boat wall structure by said mechanical fastener means, said horn support additionally including a support element rigidly connected to and solely supported by said mounting plate and extending through said wall opening and beyond the inner side of the boat wall structure when said mounting plate is attached to said boat wall structure by said mechanical fastener means;

a horn rigidly connected to said support element and solely supported by said support element at the inner side of said boat wall structure and at a location spaced from said mounting plate when said mounting plate is attached to said boat wall structure by said mechanical fastener means; and a grill member having at least one grill opening, said grill member being frictionally secured to said mounting plate and covering said mounting plate, said wall opening and said mechanical fastener means attaching said mounting plate to said boat wall structure when said mounting plate is attached to said wall structure by said mechanical fastener means, said grill member being flush mounted with respect to both said mounting plate and said boat wall structure at the outer side of the boat wall structure, said mounting plate defining an aperture in at least partial registry with said at least one grill opening and said horn including a sound emitter opening, said support element supporting said horn with said sound emitter opening thereof located closely adjacent to said mounting plate with the sound emitter opening disposed immediately adjacent to said aperture, said horn support being of integral molded plastic construction and said support element projecting laterally from said mounting plate and including an abutment surface abutting said horn, said horn support additionally comprising rigid structural members integral with and rigidly interconnecting said mounting plate and said support element.

7. The marine horn assembly according to claim 6 wherein said rigid structural members comprise a plurality of spaced rib members.

8. The marine horn assembly according to claim 6 wherein said mounting plate has a portion of increased thickness extending about said aperture.

* * * * *